United States Patent [19]
Tran

[11] Patent Number: 5,432,476
[45] Date of Patent: Jul. 11, 1995

[54] DIFFERENTIAL TO SINGLE-ENDED CONVERTER

[75] Inventor: Toan Tran, San Jose, Calif.

[73] Assignee: National Semiconductor Corporation, Santa Clara, Calif.

[21] Appl. No.: 44,949

[22] Filed: Apr. 9, 1993

[51] Int. Cl.⁶ .............................................. H03F 3/45
[52] U.S. Cl. ..................................... 330/255; 330/257; 330/258
[58] Field of Search ............... 330/255, 257, 275, 301, 330/258

[56] References Cited

U.S. PATENT DOCUMENTS 4,219,781  8/1980  Naokawa .................... 330/255 X
4,987,380  1/1991  Ishikawa .................... 330/257 X

FOREIGN PATENT DOCUMENTS 120606  6/1985  Japan ..................... 330/257
164310  7/1986  Japan ..................... 330/257
 15911  1/1987  Japan ..................... 330/257

OTHER PUBLICATIONS

Article entitled "Bipolar and MOS Analog Integrated Circuit Design" Author: Alan B. Grebene Publisher: John Wiley & Sons, Inc.—1984.

Primary Examiner—James B. Mullins
Attorney, Agent, or Firm—Limbach & Limbach; Vincenzo D. Pitruzzella

[57] ABSTRACT

A differential to single-ended converter includes a voltage-to-current converter that converts differential voltage input signals to differential current signals which differ by a difference current. A current mirror mirrors the first differential current signal. A substantially constant DC voltage level is established. A resistor conducts any difference in current between the mirrored current and the second differential current signal and translates this difference current to a single-ended voltage output signal. An input buffer provides the differential voltage input signals to the voltage-to-current converters.

8 Claims, 3 Drawing Sheets

5,432,476

DIFFERENTIAL TO SINGLE-ENDED CONVERTER

BACKGROUND OF THE INVENTION

1. Field of the Invention

The present invention relates to signal conversion and, more particularly, to circuitry for converting a differential input signal to a single-ended output signal without the use of an operational amplifier.

2. Description of Related Art

Differential to single-ended converters, which are well known in the art, are used to convert a differential input signal to a single-ended output signal. Typical prior art differential to single-ended converters are described and shown in "Bipolar and MOS Analog Integrated Circuit Design", Alan B. Grebene, pages 310–316.

Grebene's page 313 shows the basic connections for a single-ended output converter design, which is also shown in FIG. 1 of this document.

A primary disadvantage of these previously-known differential to single-ended converters is that each requires an operational amplifier. As is known, op amps have a variety of inherent drawbacks. They are complex circuits that use a large silicon area. They are somewhat unreliable and unpredictable in operation. It is difficult to manufacture them such that they are environment-independent, that is, so that they operate consistently over a wide temperature range, for example. Furthermore, their common mode voltages are not sufficiently reliable.

What is desirable, therefore, is a new and improved differential to single-ended converter which does not require an op amp, and which is small, inexpensive, reliable and predictable. It is also desirable that this new differential to single-ended converter by readily adaptable or programmable to offer a variety of operating characteristics without requiring dramatic alteration of the fabrication process or mask layout.

SUMMARY OF THE INVENTION

A differential to single-ended converter includes a voltage-to-current converter that converts differential voltage input signals to differential current signals which differ by a difference current. A current mirror mirrors the first differential current signal. A resistor conducts any difference in current between the mirrored current and the second differential current signal and translates this difference current to a single-ended voltage output signal. An input buffer provides the differential voltage input signals to the voltage-to-current converters.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

Figure 1:
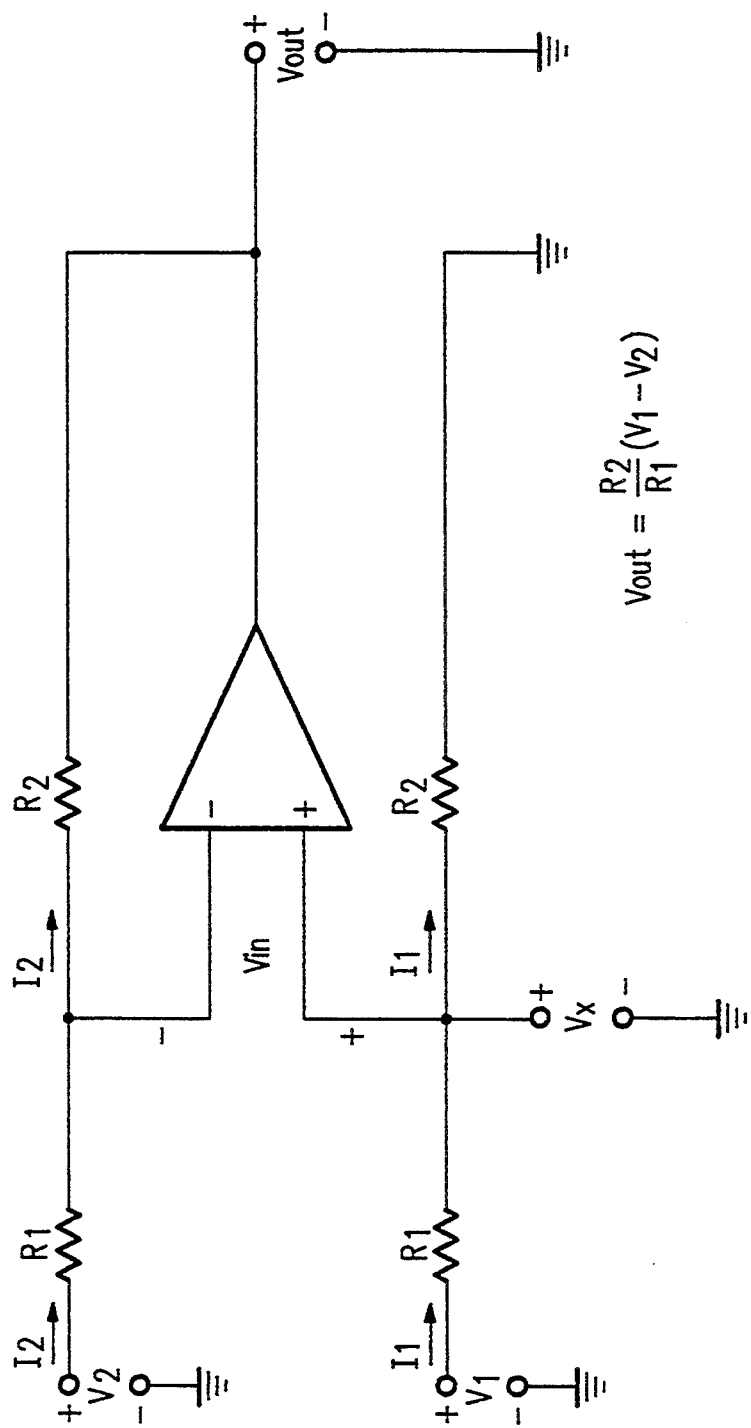
FIG. 1 is schematic diagram illustrating a conventional single-ended converter design.
Figure 2:
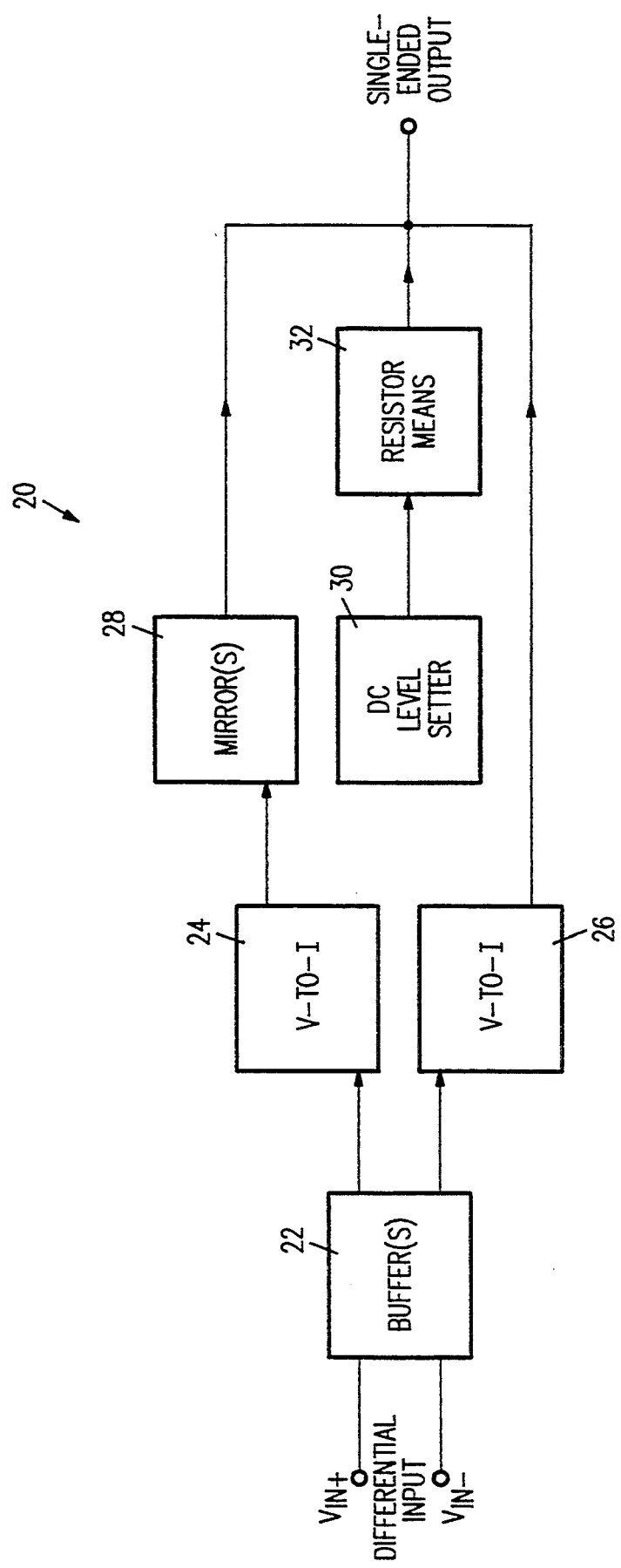
FIG. 2 is a block diagram illustrating a differential to single-ended converter in accordance with the present invention.

FIG. 2 shows a differential to single-ended converter 20. A differential input signal ($V_{IN+}$, $V_{IN-}$) is provided to an input buffer 22. The input buffer 22 provides the differential input $V_{IN+}$, $V_{IN-}$ to respective V-to-I converters 24, 26. A first of the V-to-I converters 24 provides its output to a mirror unit 28. A DC level setter 30 establishes a DC voltage level which it provides to resistor means 32. The outputs of the mirror unit 28, the resistor means 32, and the second V-to-I converter 26 are combined to provide a single-ended output signal.

It will be understood by those skilled in the art that the fundamental principles of the present invention may be practiced utilizing a variety of buffers, a variety of V-to-I converters, a variety of mirrors, a variety of DC level setters, and a variety of resistor means. The basic concept of the present invention involves the interconnection of these elements into the overall network 20 shown in FIG. 2 and, in particular, as described in greater detail below, is centered around the operative relationship between the DC level setter 30, the resistor means 32, the mirror means 28, and the second V-to-I converter 26.

Figure 3:
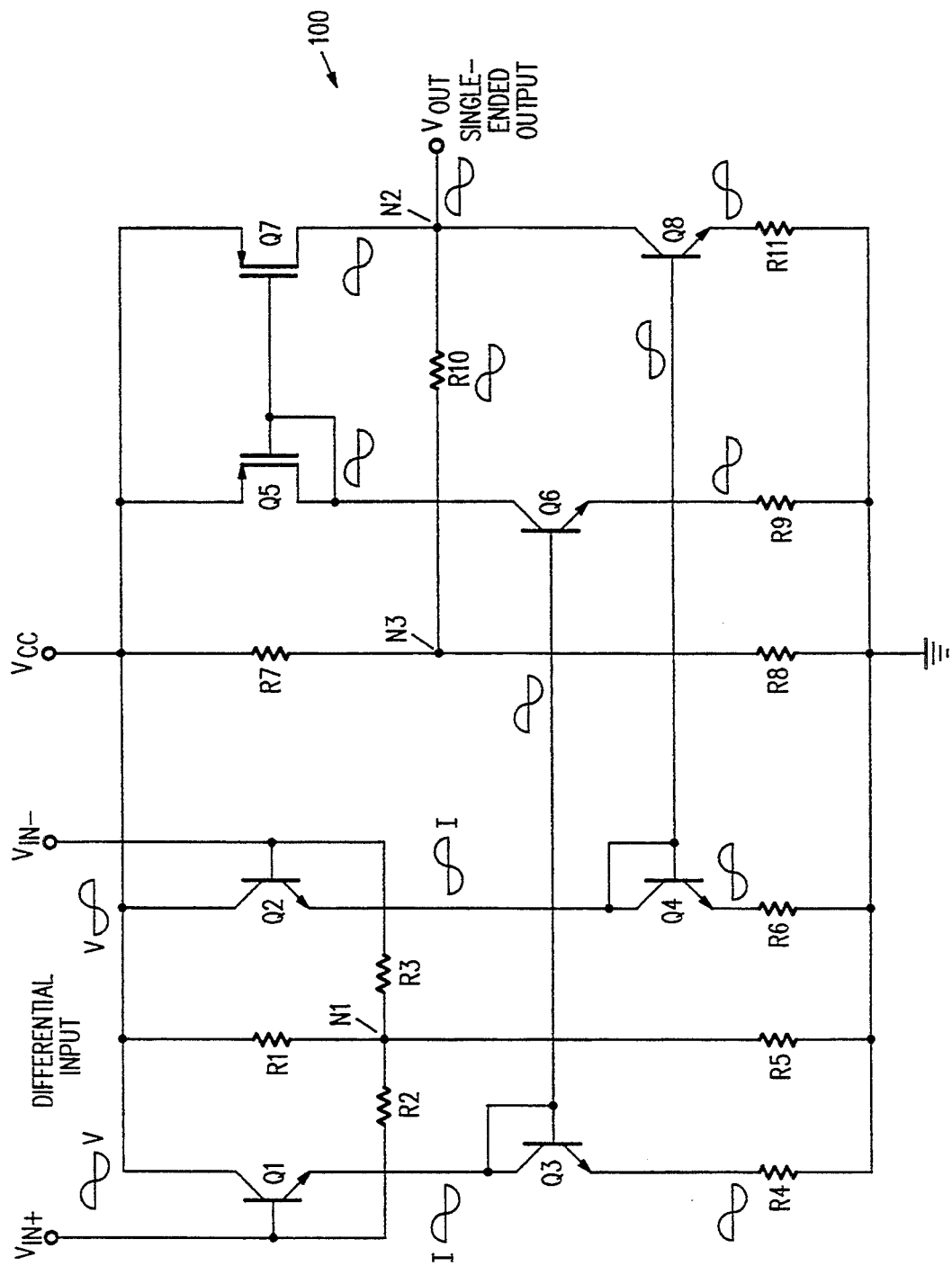
FIG. 3 is a circuit schematic illustrating an embodiment of a differential to single-ended converter in accordance with the present invention.

FIG. 3 provides a circuit schematic showing an embodiment 100 of the FIG. 2 differential to single-ended converter. As stated above, the function of the differential to single-ended converter 100 is to convert a differential input signal ($V_{IN+}$, $V_{IN-}$) to a single-ended output signal ($V_{OUT}$).

The differential to single-ended converter 100 includes an input buffer that includes npn transistors Q1 and Q2 and resistors R1, R2, R3 and R4. Signal $V_{IN+}$ is received at the base of transistor Q1, while signal $V_{IN+}$ is received at the base of transistor Q2. The collectors of transistors Q1 and Q2 are commonly coupled to a power supply voltage $V_{cc}$. Resistor R1 is coupled to supply $V_{cc}$ and to a common mode node N1. The bases of transistors Q1 and Q2 are coupled to node N1 through resistors R2 and R3, respectively. Node N1 is coupled to ground through resistor R5. Resistors R1 and R5 form a voltage divider which sets the voltage at node N1.

The emitters of transistors Q1 and Q2 provide the differential output of the buffer. The outputs of the buffer are provided to a pair of voltage-to-current (V-to-I) converters.

The first V-to-I converter includes npn transistor Q6 and resistor R9. Transistor Q3 and resistor R4 are used to form a bias current for the base drive of transistor Q6. The emitter of transistor Q1 is coupled to the collector and base of transistor Q3. The emitter of transistor Q3 is coupled to ground through resistor R4. The emitter of transistor Q1 is also coupled to the base of transistor Q6. The emitter of transistor Q6 is coupled to ground through resistor R9.

The second V-to-I converter includes npn transistor Q8 and resistor R11. Transistor Q4 and resistor R6 are used to form a bias current for the base drive of transistor Q8. The emitter of transistor Q2 is coupled to the collector and base of transistor Q4. The emitter of transistor Q4 is coupled to ground through resistor R6. The emitter of transistor Q2 is also coupled to the base of transistor Q8. The emitter of transistor Q8 is coupled to ground through resistor R11.

The two V-to-I converters provide their outputs on the collectors of transistors Q6 and Q8, respectively, to a mirror unit which includes n-channel transistors Q5 and Q7. The source of transistor Q5 is coupled to the supply $V_{cc}$, while the gate and drain of transistor Q5 are commonly coupled to the collector of transistor Q6. The source of transistor Q7 is coupled to the supply $V_{cc}$, while the drain of transistor Q7 is coupled to the collector of transistor Q8, and the gate of transistor Q7 is coupled to the gate and drain of transister Q5.

The output of the mirror unit is provided to output node N2 at the drain of transistor Q7. Node N2 is coupled through resistor R10 to a common mode setting unit. As shown in FIG. 3, the common mode setting unit may be a simple voltage divider, wherein resistors R7 and R8 are coupled in series between the supply $V_{cc}$ and ground such that the voltage divider establishes a common mode voltage at node N3. In other words, node N3 sets the center point about which the single-ended output $V_{OUT}$ swings.

The several signal waveforms shown in FIG. 3 illustrate the operation of the differential to single-ended converter 100 during one cycle time. For example, the $V_{IN+}$ input executes a sine wave function, rising above a center point, then falling back to the center point to complete a half-cycle, then falling below the center point and then rising back to the center point during a second half-cycle. The $V_{IN+}$ input operates inversely, first going below the center point, then going above it. The operation of the circuit may be understood with reference primarily to the beginning of the first half-cycle.

A rising $V_{IN+}$ input causes an increasing current through the emitter of transistor Q1. This causes the voltage at the emitter of transistor Q1 and at the base of transistor Q6 to rise. Conversely, a falling $V_{IN+}$ voltage causes the current through the emitter of transistor Q2 to decrease. This causes the voltage at the base of transistor Q8 to fall.

The rising voltage at the base of transistor Q6 causes the current through transistor Q6 to increase. This current is provided through transistor Q5. The increasing current through transistor Q5 is mirrored by transistor Q7.

Meanwhile, the falling voltage at the base of transistor Q8 causes the current through transistor Q8 to decrease. Because the current through transistor Q7 is increasing while the current through transistor Q8 is decreasing, the excess current from transistor Q7 must travel through the only other path to ground, i.e., through resistors R10 and R8. Because node N3 is held at a fixed voltage, the increasing current through resistor R10 causes the single-ended output voltage $V_{OUT}$ at node N2 to rise. Thus, a single-ended output is obtained from a differential input.

Those skilled in the art will understand how the circuit operates during other times in the cycle, particularly when viewing FIG. 3 in light of the description above.

It will also be understood by those skilled in the art that the amplitude of the voltage swing of the single-ended output $V_{OUT}$ is determined not only by the amplitude of the differential inputs $V_{IN+}$ and $V_{IN-}$, but also by the relative resistances of resistors R10, R9 and R11. All other things being equal, if the resistance of resistor R10 is increased, then the voltage swing of output $V_{OUT}$ will also be increased. If the resistances of resistors R9 and R11 are increased, then the voltage swing of output $V_{OUT}$ will be decreased.

Thus, by selecting appropriate resistor values, the circuit designer can determine that the swing of single-ended output $V_{OUT}$ will be greater than, equal to, or less than the differential input $V_{IN}$ swing, according to well-known electrical formulas and properties.

The center point about which the differential inputs swing is selected by appropriately sizing resistors R1 and R5.

In the above-described circuit 100, the various resistors may have the following values:
R1=3 kΩ
R2=2 kΩ
R3=2 kΩ
R4=8 kΩ
R5=3 kΩ
R6=8 kΩ
R7=200 Ω
R8=200 Ω
R9=8 kΩ
R10=8 kΩ
R11=8 kΩ

It will be appreciated that if resistor R10 is a variable or programmable resistor, the resistance of which can be externally controlled, then the voltage swing of single-ended output $V_{OUT}$ can also be controlled. FIG. 3 should be interpreted such that resistor R10 may be either a fixed resistor or a variable or programmable resistor. Resistors R9 and R11 may also be programmable. As described above, the output swing is dependent upon the ratio of R10:R9. Therefore, either R10 or (R9 and R11 together) may be varied to adjust the output swing.

It will be appreciated by those skilled in the art that symmetrical or matched in operation of certain components in the circuit is highly desirable. For example, it is desirable that transistors Q1 and Q2 should operate identically, and that resistors R2 and R3 should have identical resistance, and so forth. Therefore, in the semiconductor manufacturing process used in constructing the preferred embodiment of the circuit 100, the following components are formed as matched pairs, through well-known layout techniques:
Q1 and Q2
Q3 and Q4
Q6 and Q8
Q5 and Q7
R2 and R3
R4 and R6
R9 and R10 and R11

Additionally, the following sets of components may also be made to match:
Q1, Q2, Q3, Q4, Q6, and Q8
R4, R6, R9, R10, and R11

The present invention utilizes simple, well-known components, those operational characteristics of which are readily matched between respective components of to-be-matched pairs. Because the parts can be closely matched, the invention is highly temperature-independent. Because the parts are simple, well-known, and reliable, the operation of the invention is highly predictable and controllable. Because an op amp is not required, and because those components which are used are small, the invention is inexpensive both in terms of monetary cost and silicon die area.

While the invention has been illustrated as including npn and n-channel transistors, it will readily be appreciated by those skilled in the art that pnp and p-channel transistors may alternatively be used. Additionally, while the circuit has been shown in a BiCMOS embodiment selected for its operating speed, it will be appreciated that the circuit may also be constructed using bipolar, MOS or CMOS technologies.

Regardless of the types of transistors employed, each transistor will be understood to include a first and a second power terminal, such as a drain and a source, or a collector and an emitter. Each transistor will be understood to further include a control terminal, such as a gate or a base.

These and other changes should be considered as within the scope of the present invention. The invention has been described with reference to preferred modes and embodiments, but is to be defined by and afforded the full measure of protection set forth in the following claims.

I claim:

1. A circuit comprising:
   first and second ($V_{cc}$ and ground) supply nodes;
   first and second differential input nodes for receiving first and second differential input signals ($V_{IN+}$ and $V_{IN-}$), respectively;
   an output node (N2) for providing a single-ended output signal;
   first and second npn transistors (Q1 and Q2) having their collectors coupled to the first supply node, and having their bases coupled to the first and second differential input nodes, respectively;
   first and second resistors (R1 and R5) coupled in series between the first and second supply nodes to establish a common mode voltage level at a first node (N1) between said first and second resistors;
   third and fourth resistors (R2 and R3) coupled between the first node and the first differential input node, and the first node and the second differential input node, respectively, to establish a common mode voltage about which the differential input signals swing;
   a third npn transistor (Q3) having its collector and base coupled to the emitter of the first npn transistor;
   a fourth npn transistor (Q4) having its collector and base coupled to the emitter of the second npn transistor;
   fifth and sixth resistors (R4 and R6) coupled between ground and the emitters of the third and fourth npn transistors, respectively;
   means (R7 and R8) for establishing a voltage reference at a reference node (N3);
   a fifth npn transistor (Q6) having its base coupled to the base of the third npn transistor;
   a sixth npn transistor (Q8) having its base coupled to the base of the fourth npn transistor;
   a first field effect transistor (Q5) having its source coupled to the first power terminal, its drain coupled to the collector of the fifth npn transistor, and its gate coupled to its drain;
   a second field effect transistor (Q7) having a its source coupled to the first power terminal, its drain coupled to the collector of the sixth npn transistor, and the ouput node and its gate coupled to the gate of the first field effect transistor;
   seventh and eighth resistors (R9 and R11) coupled between ground and the emitters of the fifth and sixth npn transistors, respectively; and
   a tenth resistor (R10) coupled between the reference node and the output node.

2. A circuit as in claim 1 wherein the first and second npn transistors are a matched pair; the third and fourth npn transistors are a matched pair; the fifth and sixth npn transistors are a matched pair; the seventh and eighth resistors are a matched pair; and the first and second field effect transistors are a matched pair.

3. A circuit as in claim 2 wherein the first through eighth npn transistors are matched.

4. A circuit as in claim 2 wherein the third and fourth resistors are a matched pair; the fifth and sixth resistors are a matched pair; and the seventh and eighth resistors are a matched pair.

5. A differential to single-ended converter circuit for converting a differential input signal to a single-ended output signal, the converter circuit comprising:
   a first voltage-to-current converter connected to receive the differential input signal and to convert the differential input signal to a corresponding first converter current output signal;
   a current mirror connected to receive the first converter current output signal and to provide a mirrored output signal to an output node;
   a second voltage-to-current converter connected to receive the differential input signal and to convert the differential input signal to a corresponding second converter current output signal, the second voltage-to-current converter being connected to provide the second converter current output signal to the output node;
   a level setter that is coupled to the output node via a level setter resistive element to provide a level setter signal to the output node,
   wherein the resistive element is connected between the output node and a common mode node, and the level setter includes a first level setter resistive element connected between the common mode node and a positive power supply and a second level setter resistive element connected between the common mode node and a negative power supply,
   whereby the mirrored output signal, the second converter current output signal and the level setter signal combine at the output node to provide the single-ended output signal.

6. A differential to single-ended converter circuit as in claim 5 and further including an input buffer that receives the differential input signal and is connected to provide the differential input signal to the first and second voltage-to-current converters.

7. A differential to single-ended converter circuit as in claim 5, and wherein the differential input signal includes first and second input signals, and further comprising:
   first and second npn input transistors having their collectors commonly coupled to the positive power supply, the base of the first npn input transistor connected both to receive the first input signal and to an input node via a first input resistor, the base of the second npn input transistor connected both to receive the second input signal and to the input node via a second input resistor, the input node connected to the positive power supply via a third input resistor and to the negative power supply via a fourth input resistor;

a first bias generator that includes a first npn bias generator transistor having its commonly-coupled collector and base connected to the emitter of the first npn input transistor and its emitter coupled to the negative power supply via a first bias generator resistor; and a second bias generator that includes a second npn bias generator transistor having its commonly-coupled collector and base connected to the emitter of the second npn input transistor and its emitter coupled to the negative power supply via a second bias generator resistor.

8. A differential to single-ended converter circuit as in claim 7 and wherein the first voltage-to-current converter includes a first npn converter transistor having its base connected to the emitter of the first npn input transistor and its emitter connected to the negative power supply via a first converter resistor and wherein the second voltage-to-current converter includes a second npn converter transistor having its base connected to the emitter of the second npn input transistor, its emitter connected to the negative power supply via a second converter resistor and its collector connected to the output node.

* * * * *

UNITED STATES PATENT AND TRADEMARK OFFICE
CERTIFICATE OF CORRECTION

PATENT NO. : 5,432,476
DATED : July 11, 1995
INVENTOR(S) : Toan Tran

It is certified that error appears in the above-indentified patent and that said Letters Patent is hereby corrected as shown below:

In Col. 5, line 53, please delete the "S" in parenthesis and replace with the number --8--.

Signed and Sealed this

Third Day of October, 1995

Attest:

BRUCE LEHMAN

Attesting Officer

Commissioner of Patents and Trademarks